US008421813B2

(12) United States Patent
Takase

(10) Patent No.: US 8,421,813 B2
(45) Date of Patent: Apr. 16, 2013

(54) DISPLAY DEVICE AND METHOD OF CONTROLLING DISPLAY DEVICE

(75) Inventor: Hiroshi Takase, Gifu (JP)

(73) Assignee: Sony Corporation, Tokyo (JP)

( * ) Notice: Subject to any disclaimer, the term of this patent is extended or adjusted under 35 U.S.C. 154(b) by 680 days.

(21) Appl. No.: 12/639,499

(22) Filed: Dec. 16, 2009

(65) Prior Publication Data

US 2010/0156927 A1 Jun. 24, 2010

(30) Foreign Application Priority Data

Dec. 19, 2008 (JP) ................................ P2008-323366

(51) Int. Cl.

| | |
|---|---|
| ***G02F 1/00*** | (2006.01) |
| ***G03F 3/08*** | (2006.01) |
| ***G06K 9/00*** | (2006.01) |
| ***G06K 9/40*** | (2006.01) |
| ***G06T 15/60*** | (2006.01) |
| ***G09G 5/00*** | (2006.01) |
| ***G09G 5/02*** | (2006.01) |
| ***G09G 3/30*** | (2006.01) |
| ***H04N 17/00*** | (2006.01) |
| ***H04N 5/57*** | (2006.01) |
| ***H04N 9/64*** | (2006.01) |
| ***H04N 1/46*** | (2006.01) |

(52) U.S. Cl.

USPC ........... 345/589; 345/426; 345/606; 345/207; 345/690; 345/77; 348/180; 348/602; 348/655; 348/687; 348/708; 358/509; 358/516; 358/518; 358/520; 358/525; 382/162; 382/167; 382/254; 382/274; 359/237

(58) Field of Classification Search .................. 345/426, 345/581, 589–591, 597, 600–601, 606, 611–613, 345/617–618, 549, 207, 690, 48–50, 63, 345/76–77, 84, 87–89, 903; 348/179–180, 348/254, 383, 560, 571, 602–603, 612, 655, 348/687, 708, 724, 739, 759–761; 358/509, 358/516, 518–520, 523–525, 447–448; 382/162, 382/167, 254, 274, 276, 312; 359/227, 237, 359/242, 389, 395, 642

See application file for complete search history.

(56) References Cited

U.S. PATENT DOCUMENTS

2003/0020725 A1* 1/2003 Matsuda ........................ 345/600
2007/0058108 A1* 3/2007 Uehara et al. .................... 349/86
2009/0289951 A1* 11/2009 Matsuda ........................ 345/589
2011/0128306 A1* 6/2011 Utsumi et al. ................ 345/690

FOREIGN PATENT DOCUMENTS

CN 101211539 7/2008
JP 7 294889 11/1995
JP 10 49074 2/1998
JP 2001 265296 9/2001
JP 2002 149135 5/2002
JP 2006 31977 2/2006

* cited by examiner

*Primary Examiner* — Wesner Sajous

(74) *Attorney, Agent, or Firm* — Frommer Lawrence & Haug LLP; William S. Frommer

(57) ABSTRACT

A display device includes a light modulating unit configured to modulate light based on a video signal, a light source configured to supply light to the light modulating unit, a detecting unit configured to detect a light amount of the light source, and a control unit configured to perform control for correcting the video signal based on the detected light amount so as to attain a color temperature and brightness that had already been set.

9 Claims, 8 Drawing Sheets

DISPLAY DEVICE AND METHOD OF CONTROLLING DISPLAY DEVICE

BACKGROUND OF THE INVENTION

1. Field of the Invention

The present invention relates to a display device and a method of controlling the display device. More specifically, the present invention relates to a display device configured to control the color temperature and the brightness of a light source supplying light to a light modulating unit, and a method of controlling the display device.

2. Description of the Related Art

In the past, cold cathode fluorescent lamps (CCFLs) have been widely used as backlights which are the light sources of liquid crystal display devices. Since the CCFL has a diameter smaller than that of a hot cathode fluorescent lamp (HCFL) and has a life longer than that of the HCFL, the CCFL can be appropriately used as the backlight of the liquid crystal display device.

Controlling a display device having a backlight is disclosed in Japanese Unexamined Patent Application Publication No. 2001-265296, Japanese Unexamined Patent Application Publication No. 2002-149135, Japanese Unexamined Patent Application Publication No. 2006-31977, Japanese Unexamined Patent Application Publication No. 07-294889, and Japanese Unexamined Patent Application Publication No. 10-49074.

SUMMARY OF THE INVENTION

However, if the color gamut of a light source is varied due to a change in brightness, the RGB chrominance point of the light source is varied and the color temperature of the light source is shifted.

The present invention has been achieved to present a technology of performing control so as to attain a color temperature and brightness that had already been set even though the color amount of a light source is changed.

A display device according to an embodiment of the present invention includes a light modulating unit configured to modulate light based on a video signal, a light source configured to supply light to the light modulating unit, a detecting unit configured to detect a light amount of the light source, and a control unit configured to perform control for correcting the video signal based on the detected light amount so as to attain a color temperature and brightness that had already been set.

According to an embodiment of the present invention, a method of controlling a display device is provided, where the method includes the steps of detecting an amount of light supplied from a light source when the light is modulated for display based on a video signal, and performing control to correct the video signal based on the detected light amount so as to attain a color temperature and brightness that had already been set.

According to the above-described embodiments of the present invention, the light amount of the light source is detected, and the video signal is corrected so as to attain the color temperature and the brightness that had already been set. Therefore, it becomes possible to keep a color temperature that had already been set even though a chromaticity is changed due to a variation in the brightness of the light source.

Here, the detecting unit detects the light amount of the light source for each of the colors red (R), green (G), and blue (B). Accordingly, the control unit calculates the RGB adjusted values of video signals based on the detected RGB light amounts so as to attain the color temperature and the brightness that had already been set, and corrects the video signals based on the adjusted values.

The control unit converts the detected RGB light amounts into chromaticity information and brightness information, and calculates the RGB adjusted values of the video signals based on the converted RGB chromaticity information and the converted RGB brightness information so as to attain the color temperature and the brightness that had already been set.

The chromaticity of the light source is changed due to a variation in the brightness, as is the case with the CCFL. The light modulating unit modulates light through liquid crystal, for example.

The present invention allows for attaining a color temperature and brightness that had already been set even though the light amount of a light source is varied so that a change occurs in the chromaticity of the light source.

BEST MODES FOR IMPLEMENTING PRESENT INVENTION

Hereinafter, the best modes (hereinafter referred to as embodiments) for implementing the present invention will be described. The description will be given in the following order.

1. Schematic Configuration of Display Device (Arrangement of Components, Block Configuration, Display Operations (Control Method))
2. First Embodiment (Block Configuration, Operations)
3. Second Embodiment (Block Configuration, Operations)
4. Third Embodiment (Block Configuration, Operations)
5. Specific Examples

1. Schematic Configuration of Display Device

Arrangement of Components

Figure 1:
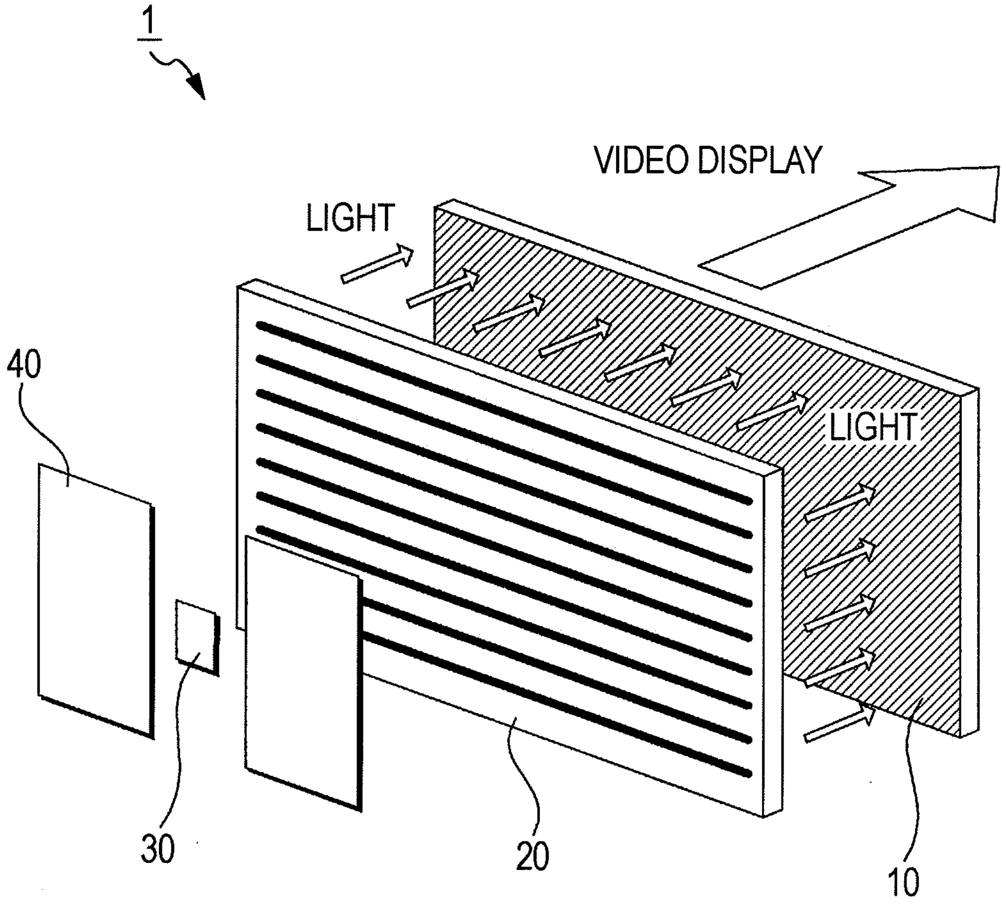
FIG. 1 is an exploded perspective view illustrating the schematic configuration of a display device according to an embodiment of the present invention.

FIG. 1 is an exploded perspective view illustrating a schematic configuration of a display device 1 according to an embodiment of the present invention. The above-described display device 1 includes a light modulating unit 10, a light source 20, a detecting unit 30, and a control unit 40.

The light modulating unit 10 modulates light based on a video signal. For example, the light modulating unit 10 includes a liquid crystal panel, modulates the light of the light source 20 based on the video signal in pixels, and performs video display.

The light source 20 supplies light to the light modulating unit 10. For example, the light source 20 includes a cold cathode fluorescent lamp (CCFL), which is effective for the above-described embodiment particularly when the chromaticity of the light source 20 is changed due to a variation in brightness.

The detecting unit 30 is provided to detect the amount of light emitted from the light source 20. The control unit 40 calculates the brightness based on the light amount detected through the detecting unit 30 and performs control to correct a video signal supplied to the light modulating unit 10 so as to attain a color temperature and brightness that had already been set.

The color modulating unit 10 provided in the display device 1 is shaped into a panel including a plurality of pixels arranged in matrix form. Further, the light source 20 is also shaped into a panel suitable for the size of the light modulating unit 10. If the light source 20 includes a plurality of the CCFLs, the CCFLs are arranged on a face of the panel at a predetermined pitch so that the entire face of the light modulating unit 10 is supplied with light. The light source 20 is provided on the back face (opposite to the video display face) of the light modulating unit 10 so as to supply light from the back face of the light modulating unit 10.

The detecting unit 30 is provided on the back face of the light source 20 (opposite to the face where the light modulating unit 10 is provided) so as to detect the amount of light supplied from the light source 20. Further, the control unit 40 is provided on the back face of the light face 20 and includes various circuits provided on a substrate.

The above-described light modulating unit 10, light source 20, detecting unit 30, and control unit 40 are incorporated in a cabinet (not shown).

[Block Configuration]

Figure 2:
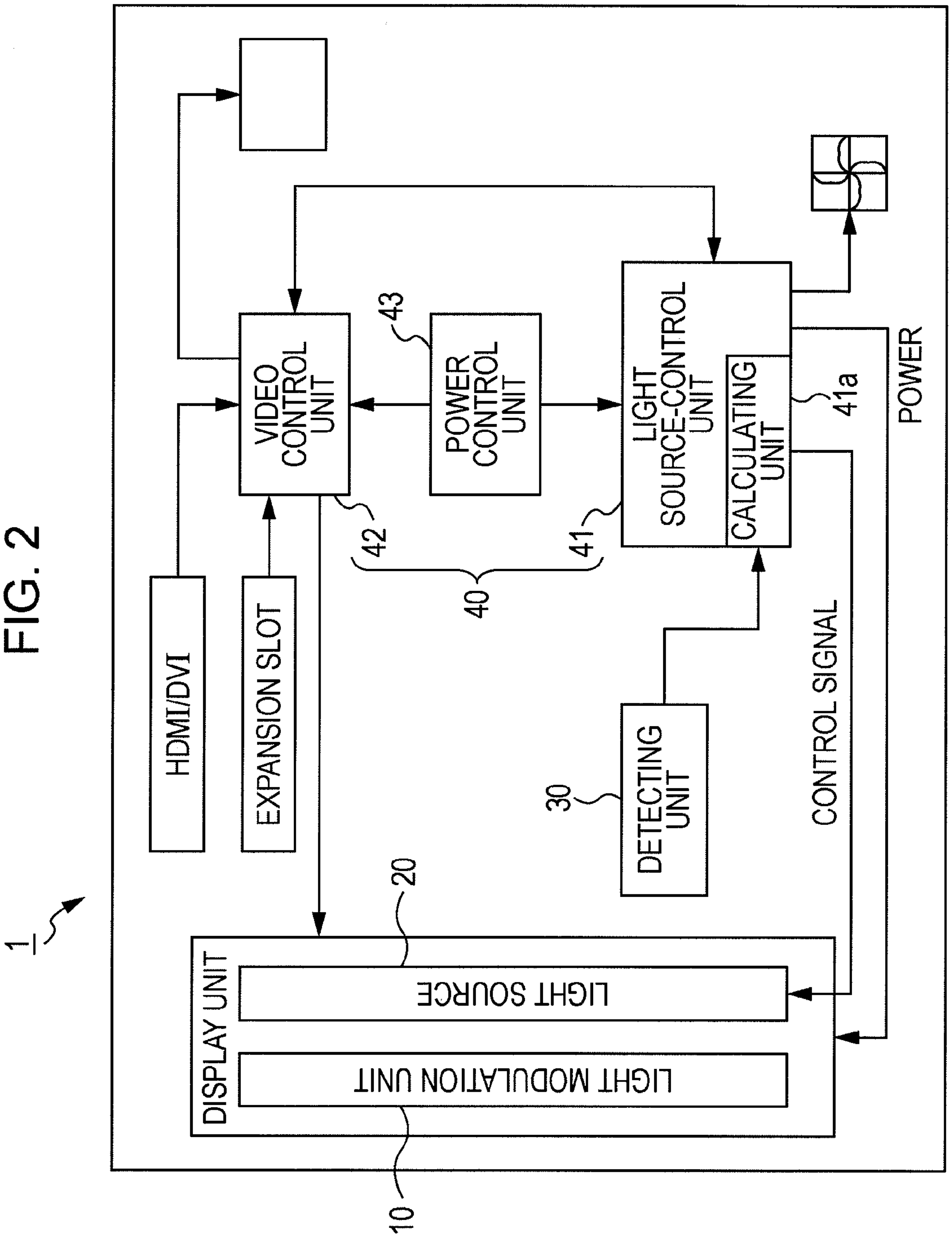
FIG. 2 illustrates the block configuration of the display device.

FIG. 2 illustrates the block configuration of the display device 1. The above-described light modulating unit 10 and light source 20 are stacked on each other so that a display unit is configured. The detecting unit 30 is provided on the back-face side of the light source 20 included in the display unit so that the detecting unit 30 detects the amount of light emitted to the back-face side of the light source 20. The light emitted to the back-face side of the light source 20 is the same as that emitted to the front-face side on which the light modulating unit 10 is arranged. Namely, detecting the light amount on the back-face side is equivalent to detecting the amount of light supplied to the light modulating unit 10. When a reflective film is provided on the back-face side of the light source 20, light that passed through the reflective film is detected. Otherwise, at least one hole is bored through the reflective film at the position corresponding to the light-receptive spot of the detecting unit 30 so that light emitted from the light source 20 is detected via the above-described hole.

The control unit 40 includes a light-source control unit 41 and a video control unit 42. A signal detected through the detecting unit 30 is transmitted to a calculation unit 41*a* of the light-source control unit 41 where various calculations are performed. For example, the signal is converted into a color temperature and/or brightness, and an adjusted value is calculated. The light-source control unit 41 transmits a control signal to the light source 20 to control the amount of light (brightness) emitted from the light source 20. The control signal is generated through pulse width modulation (PWM), for example.

The light-source control unit 40 transmits data of the calculated adjusted value to the video control unit 42 and performs control to correct the video signal. The video control unit 42 controls modulation performed for each of the pixels of the light modulating unit 10 based on a video signal transmitted from an external video input end (including a high-definition multimedia interface (HDMI), a digital visual interface (DVI), an expansion slot, etc.).

A power control unit 43 supplies power to each of the light-source control unit 41 and the video control unit 42. A power potential transmitted from the power control unit 43 is supplied to the light source 10 via the light source-control unit 41 and supplied to the light modulating unit 10 via the video control unit 42.

[Display Operations (Control Method)]

Display operations performed by the display device 1 shown in FIGS. 1 and 2 will be described. First, upon receiving a video signal transmitted from the external video input end (the HDMI and/or the DVI, the expansion slot, etc.), the video control unit 42 transmits a drive signal to the pixels corresponding to colors including red (R), green (G), blue (B).

On the other hand, the light source-control unit 41 transmits a control signal to the light source 20 so that the light source 20 supplies light having predetermined brightness to the light modulating unit 10. The light supplied to the light modulating unit 10 is subjected to modulation for each of pixels driven based on the video signal, and externally transmitted as the magnitude signal corresponding to each of the colors R, G, and B. Consequently, video is displayed.

In the display device 1 of the above-described embodiment, the amount of light emitted from the light source 20 is detected through the detecting unit 30 and the adjusted value of the video signal is calculated through the calculating unit 41*a* of the light-source control unit 41 so as to attain a color temperature and a brightness that had already been set. Data of the above-described adjusted value is transmitted to the video control unit 42 so that a video signal transmitted from the video control unit 42 to the light modulating unit 10 is adjusted. Consequently, even though the brightness of light emitted from the light source 20 is changed, it becomes possible to adjust the displacement of the chromaticity of each of the colors R, B, and G, which is caused by the changed brightness, so that the above-described color temperature and brightness that had already been set are attained.

Hereinafter, specific embodiments attained through the display device 1 according to the above-described embodiment will be described.

2. First Embodiment

Block Configuration

Figure 3:
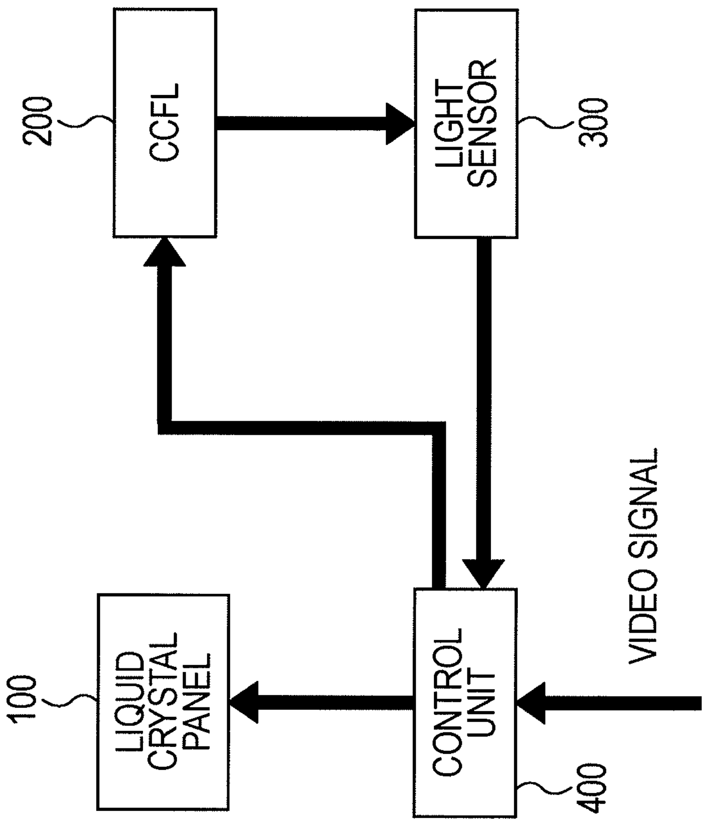
FIG. 3 is a block diagram illustrating a display device according to a first embodiment of the present invention.

FIG. 3 is a block diagram illustrating a display device according to a first embodiment of the present invention. In the above-described embodiment, a liquid crystal panel 100 is provided as a light modulating unit, a CCFL 200 is provided as a light source, a light sensor 300 is provided as a detecting unit, and a control unit 400 is provided as a control unit.

In the above-described display device, the CCFL 200 is used as a backlight configured to supply light to the liquid crystal panel 100. In the liquid crystal panel 100, liquid crystal for each pixel is driven through a drive signal generated based on a video signal transmitted from the control unit 400.

Consequently, light supplied from the CCFL 200 is modulated and video data is output.

The light sensor 300 detects the amount of light supplied from the CCFL 200 and transmits data of the detection to the control unit 400. The control unit 400 includes a light-source control unit 41 and a video control unit 42 (see FIG. 2) so that chromaticity information and brightness information are calculated based on the light amount detected through the light sensor 300, and the video signal is corrected so that the color temperature and the brightness that had already been set are attained. Further, control is performed to correct the brightness of the CCFL 200 by as much as a change in the brightness of the CCFL 200, the change being caused due to the above-described video signal correction.

[Operations]

The display device according to the above-described embodiment performs the following operations. First, upon receiving an externally transmitted video signal, the control unit 400 drives each of the pixels provided in the liquid crystal panel 100 based on the above-described video signal so that video is displayed on the liquid crystal panel 100.

When the video display is performed, the amount of light supplied from the CCFL 200 used as the backlight of the liquid crystal panel 100 is controlled based on a control signal (a signal generated through PWM, for example) transmitted from the control unit 400.

When light is supplied from the CCFL 200 to the liquid crystal panel 100, the light sensor 300 detects the amount of light supplied from the CCFL 200. Data of the light amount detected through the light sensor 300 is transmitted to the control unit 400 so that the control unit 400 calculates the chromaticity information and the brightness information based on the detected light amount data transmitted from the light sensor 300.

The control unit 400 calculates an adjusted value based on a color temperature (e.g., white balance expressed as D65, D50, and so forth) and a brightness that had already been set, and the chromaticity information and the brightness information that are calculated based on the detected light amount. Further, the control unit 400 corrects the video signal based on the calculated adjusted value and transmits the corrected video signal to the liquid crystal panel 100. Further, the control unit 400 corrects the brightness of the CCFL 200, because the brightness is changed due to the video signal corrected based on the adjusted value.

The light sensor 300 detects the corrected brightness of the CCFL 200, and the corrected brightness is fed back to the control unit 400. The detection of the light amount of the CCFL 200, the chromaticity adjustment, and the brightness correction are repeatedly performed so that the CCFL 200 can be adjusted to the color temperature and the brightness that had already been set.

3. Second Embodiment

Block Configuration

Figure 4:
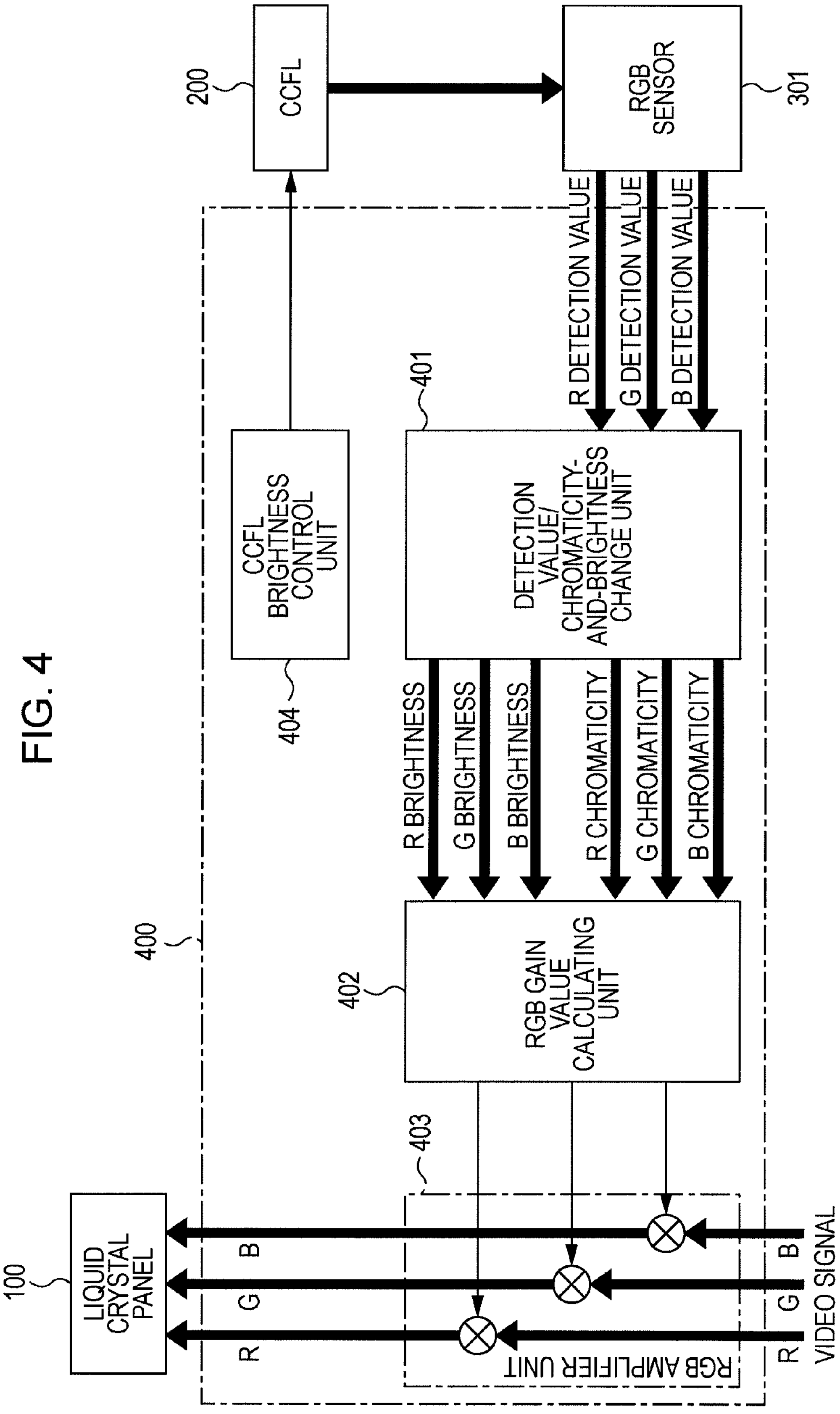
FIG. 4 is a block diagram illustrating a display device according to a second embodiment of the present invention.

FIG. 4 is a block diagram illustrating a display device according to a second embodiment of the present invention. In the above-described embodiment, the liquid crystal panel 100 is provided as a light modulating unit, the CCFL 200 is provided as a light source, an RGB sensor 301 is provided as a detecting unit, and the control unit 400 is provided as a control unit.

In the above-described display device, the CCFL 200 is used as a backlight configured to supply light to the liquid crystal panel 100. In the liquid crystal panel 100, liquid crystal for each pixel is driven through a drive signal generated based on a video signal transmitted from the control unit 400. Consequently, light supplied from the CCFL 200 is modulated and video data is output.

The RGB sensor 301 detects the amount of light supplied from the CCFL 200 for each of the colors R, G, and B, and transmits the detection data to the control unit 400 including a detection value-to-chromaticity/brightness conversion unit 401, an RGB gain value-calculating unit 402, an RGB amplifier unit 403, and a CCFL brightness control unit 404.

Consequently, the brightness of the CCFL 200 is adjusted based on a control signal transmitted from the CCFL brightness control unit 404. Further, data of the light amount corresponding to each of the colors R, G, and B, which is detected through the RGB sensor 301, is converted into the chromaticity information and the brightness information that correspond to each of the colors R, G, and B through the detection value-to-chromaticity/brightness conversion unit 401. The RGB gain value-calculating unit 402 calculates the gain value of an RGB video signal so that the chromaticity information and the brightness information that correspond to each of the colors R, G, and B individually become a color temperature and a brightness that had already been set. The RGB amplifier unit 403 adjusts the RGB video signal based on the above-described gain value, and the adjusted video signal is transmitted to the liquid crystal panel 100.

[Operations]

The display device according to the above-described embodiment performs the following operations. First, upon receiving externally transmitted video signals corresponding to the individual colors R, G, and B, the RGB amplifier unit 403 of the control unit 400 drives pixels provided in the liquid crystal panel 100 based on the RGB video signals, the pixels corresponding to the individual colors R, G, and B, so that video is displayed on the liquid crystal panel 100.

When the video display is performed, the amount of light supplied from the CCFL 200 used as the backlight of the liquid crystal panel 100 is controlled based on a control signal (a signal generated through PWM, for example) transmitted from the CCFL brightness-control unit 404 of the control unit 400.

When light is supplied from the CCFL 200 to the liquid crystal panel 100, the RGB sensor 301 detects the amount of light supplied from the CCFL 200 for each of the colors R, G, and B. Data of the detected light amounts corresponding to the individual colors R, G, and B is transmitted to the detection value-to-chromaticity/brightness conversion unit 401 of the control unit 400.

The detection value-to-chromaticity/brightness conversion unit 401 calculates chromaticity information (e.g., the coordinates (x, y) of a monochromatic chromaticity, which is shown in an xy color system) and brightness information (e.g., the value Y of a monochromatic brightness) for each of the colors R, G, and B based on the light amount data detected for each of the colors R, G, and B, the light amount data being transmitted from the RGB sensor 301. The chromaticity information and the brightness information that are calculated for each of the colors R, G, and B are transmitted to the RGB gain value-calculating unit 402.

The RGB gain value-calculating unit 402 calculates a gain (adjusted value) used to correct the level of each of the video signals corresponding to the individual colors R, G, and B based on the differences between the chromaticity information and the brightness information that correspond to the individual colors R, G, and B, the chromaticity information and the brightness information being transmitted from the detection value-to-chromaticity/brightness conversion unit 401, and the color temperature (for example, white balance expressed as D65, D50, and so forth) and the brightness that had already been set. Data of the above-described gain is transmitted to the RGB amplifier unit 403.

The RGB amplifier unit 403 provides the transmitted video signals corresponding to the individual colors R, G, and B with gain data items corresponding to the individual colors R, G, and B, the gain data items being transmitted from the RGB gain value calculating unit 402 so that the video signals are corrected. The corrected RGB video signals are transmitted to the liquid crystal panel 100 so that video having the color temperature and the brightness that had already been set is displayed.

4. Third Embodiment

Block Configuration

Figure 5:
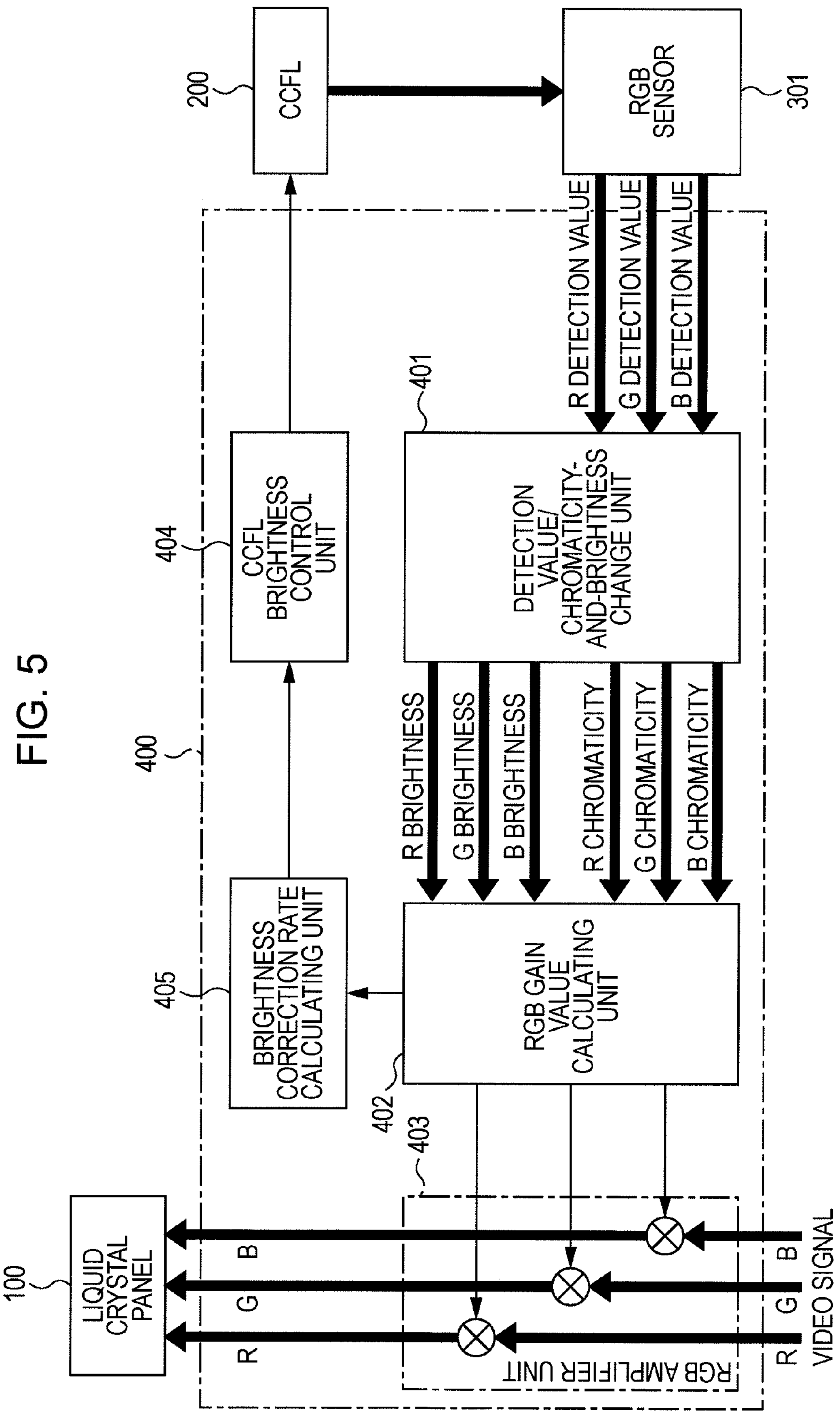
FIG. 5 is a block diagram illustrating a display device according to a third embodiment of the present invention.

FIG. 5 is a block diagram illustrating a display device according to a third embodiment of the present invention. In the above-described embodiment, the liquid crystal panel 100 is provided as a light modulating unit, the CCFL 200 is provided as a light source, the RGB sensor 301 is provided as a detecting unit, and the control unit 400 is provided as a control unit.

In the above-described display device, the CCFL 200 is used as a backlight configured to supply light to the liquid crystal panel 100. In the liquid crystal panel 100, liquid crystal for each pixel is driven through a drive signal generated based on a video signal transmitted from the control unit 400. Consequently, light supplied from the CCFL 200 is modulated and video data is output.

The RGB sensor 301 detects the amount of light supplied from the CCFL 200 for each of the colors R, G, and B, and transmits the detection data to the control unit 400 including the detection value-to-chromaticity/brightness conversion unit 401, the RGB gain value-calculating unit 402, the RGB amplifier unit 403, the CCFL brightness control unit 404, and a brightness correction rate-calculating unit 405.

Consequently, the brightness of the CCFL 200 is adjusted based on a control signal transmitted from the CCFL brightness control unit 404. Further, data of the light amount corresponding to each of the colors R, G, and B, which is detected through the RGB sensor 301, is converted into the chromaticity information and the brightness information that correspond to each of the colors R, G, and B through the detection value-to-chromaticity/brightness conversion unit 401. The RGB gain value-calculating unit 402 calculates the gain value of an RGB video signal so that the chromaticity information and the brightness information that correspond to each of the colors R, G, and B individually become a color temperature and a brightness that had already been set.

The RGB amplifier unit 403 adjusts the RGB video signal based on the above-described gain value, and the adjusted video signal is transmitted to the liquid crystal panel 100. Further, the brightness correction rate-calculating unit 405 calculates the brightness correction rate so as to correct the brightness by as much as a change in the brightness, the change occurring due to the adjustment of the video signal. The CCFL brightness control unit 404 controls the brightness of the CCFL 200 based on the above-described correction rate.

[Operations]

The display device according to the above-described embodiment performs the following operations. First, upon receiving the externally transmitted video signals corresponding to the individual colors R, G, and B, the RGB amplifier unit 403 of the control unit 400 drives pixels provided in the liquid crystal panel 100 based on the RGB video signals, the pixels corresponding to the individual colors R, G, and B, so that video is displayed on the liquid crystal panel 100.

When the video display is performed, the amount of light supplied from the CCFL 200 which is used as the backlight of the liquid crystal panel 100 is controlled based on a control signal (a signal generated through PWM, for example) transmitted from the CCFL brightness-control unit 404 of the control unit 400.

When light is supplied from the CCFL 200 to the liquid crystal panel 100, the RGB sensor 301 detects the amount of light supplied from the CCFL 200 for each of the colors R, G, and B. Data of the detected light amounts corresponding to the individual colors R, G, and B is transmitted to the detection value-to-chromaticity/brightness conversion unit 401 of the control unit 400. The detection value-to-chromaticity/brightness conversion unit 401 calculates chromaticity information (e.g., the coordinates (x, y) of a monochromatic chromaticity, which is shown in an xy color system) and brightness information (e.g., the value Y of a monochromatic brightness) for each of the colors R, G, and B based on the light amount data detected for each of the colors R, G, and B, the light amount data being transmitted from the RGB sensor 301. The chromaticity information and the brightness information that are calculated for each of the colors R, G, and B are transmitted to the RGB gain value-calculating unit 402.

The RGB gain value-calculating unit 402 calculates a gain (adjusted value) used to correct the level of each of the video signals corresponding to the individual colors R, G, and B based on the differences between the chromaticity information and the brightness information that correspond to the individual colors R, G, and B, the chromaticity information and the brightness information being transmitted from the detection value-to-chromaticity/brightness conversion unit 401, and the color temperature (for example, white balance expressed as D65, D50, and so forth) and the brightness that had already been set. Data of the above-described gain is transmitted to the RGB amplifier unit 403.

The RGB amplifier unit 403 provides the transmitted video signals corresponding to the individual colors R, G, and B with gain data items corresponding to the individual colors R, G, and B, the gain data items being transmitted from the RGB gain value-calculating unit 402 so that the video signals are corrected. The corrected RGB video signals are transmitted to the liquid crystal panel 100.

Further, the gain calculated through the RGB gain value-calculating unit 402 is also transmitted to the brightness correction rate-calculating unit 405. The brightness correction rate-calculating unit 405 calculates a change in the brightness from the adjusted RGB video signals based on the gain data items corresponding to the individual colors R, G, and B, the gain data items being transmitted from the RGB gain value-calculating unit 402, and calculates the correction rate so as to correct the change in the brightness. The CCFL brightness-control unit 404 controls the brightness of the CCFL 200 based on the correction rate.

The amount of light supplied from the CCFL 200 is sequentially detected through the RGB sensor 301. Therefore, after the brightness of the CCFL 200 is corrected through the CCFL brightness control unit 404, the RGB sensor 301 detects the light amount obtained after the correction is performed. The detection value is transmitted to the control unit 400 once again. Then, the conversion calculation, the gain-value calculation, and the RGB video signal adjustment are individually repeated by the detection value-to-chromaticity/brightness conversion unit 401, the RGB gain value-calculating unit 402, and the RGB amplifier unit 403. Consequently, video having the color temperature and the brightness that had already been set is displayed.

5. Specific Examples

Block Configuration

Figure 6:
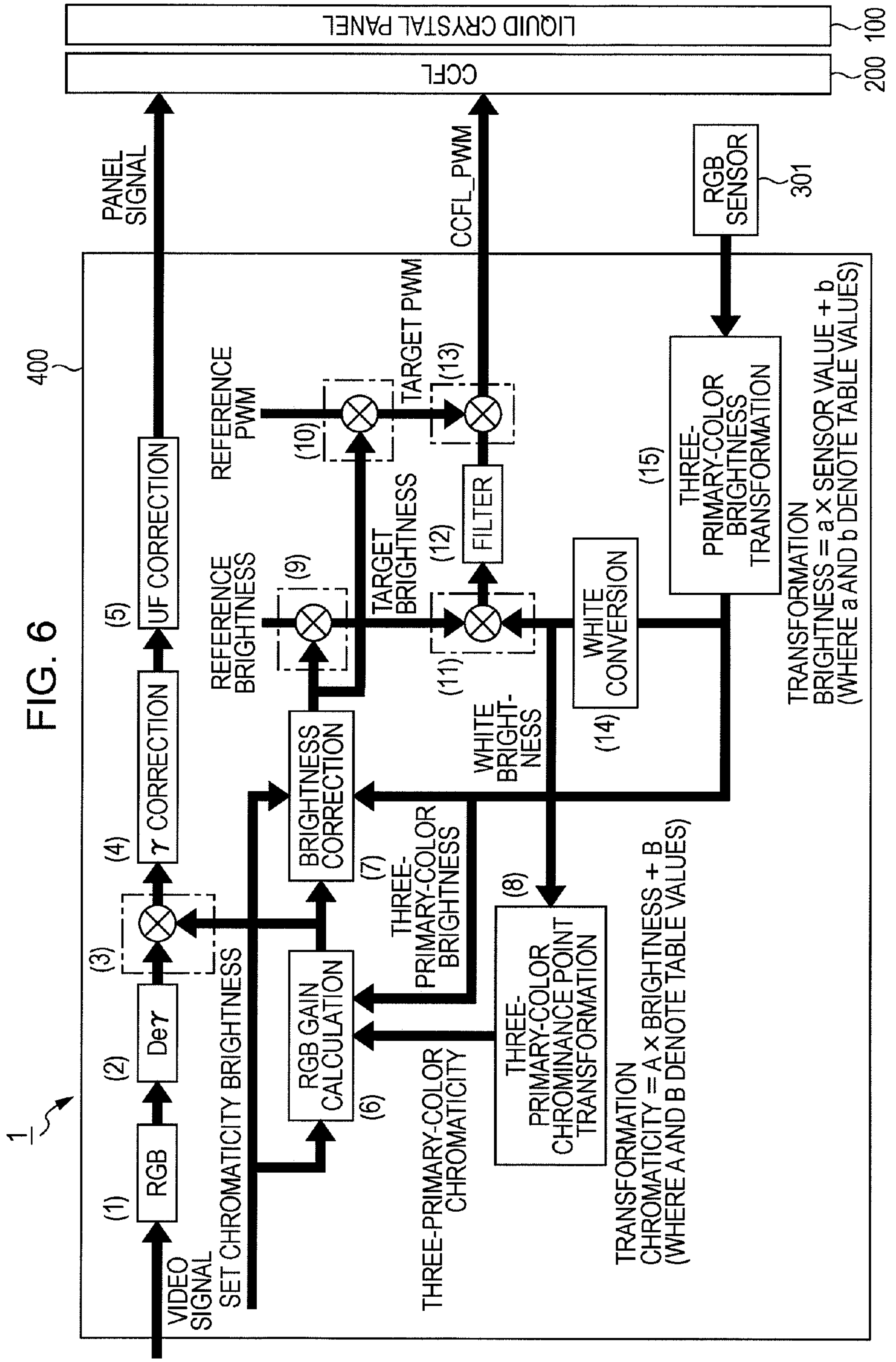
FIG. 6 is a functional block diagram illustrating a specific example of a display device according to an embodiment of the present invention.

FIG. 6 is a functional block diagram illustrating a specific example of the display device according to an embodiment of the present invention. FIG. 6 mainly illustrates the operations of each of the units provided in the control unit 400 of the display device according to the third embodiment shown in FIG. 5, as functional blocks (see reference numerals shown inside the parentheses).

[Illustration of Functions of Units]

(1) An externally transmitted video signal is converted into a red (R) video signal, a green (G) video signal, and a blue (B) video signal.

(2) The γ curve of the video signal is converted into a linear signal through de-gamma processing.

(3) The level of each of the signals corresponding to the individual colors R, G, and B is corrected by applying a gain to each of the RGB video signals.

(4) The linear video signal is converted into a signal having the γ curve by taking the γ curve of the liquid crystal panel into account.

(5) The uniformity (evenness) of data displayed on the liquid crystal panel is corrected.

(6) The gain of each of the colors R, G, and B is calculated based on the set chromaticity information and the chromaticity brightness information transmitted from the RGB sensor, so as to correct the video signal.

(7) A gain used to correct the brightness is calculated based on the brightness amount changing in accordance with the gain of each of the colors R, G, and B, and the brightness information transmitted from the RGB sensor.

(8) The brightness information transmitted from the RGB sensor is converted into the chromaticity information.

(9) A target brightness value is calculated based on the gain calculated through the functions described in (7).

(10) A target PWM value is calculated based on the gain calculated through the functions described in (7).

(11) A feedback coefficient is calculated based on the ratio between the target brightness value and a brightness value acquired from the RGB sensor.

(12) A feedback coefficient filter is provided to reduce oscillation.

(13) The target PWM value is multiplied by the feedback coefficient so that a PWM value for the CCFL is calculated.

(14) The brightnesses of the colors R, G, and B are merged with one another so that white brightness is calculated.

(15) The output value of the RGB sensor is converted into the brightness information corresponding to each of the colors R, G, and B.

Of the above-described functions, the functions (8), (14), and (15) are performed through the detection value-to-chromaticity/brightness conversion unit 401 shown in FIG. 5. Further, of the above-described functions, the function (6) is performed through the RGB gain value-calculating unit 402 shown in FIG. 5. Still further, the function (3) is performed through the RGB amplifier unit 403 shown in FIG. 5. Still further, the functions (9) and (10) are performed through the CCFL brightness control unit 404 shown in FIG. 5. Still further, the function (7) is performed through the brightness correction rate-calculating unit 405 shown in FIG. 5.

[Operations]

Next, operations performed through the specific example of the display device shown in FIG. 6 will be described.

(Operation 1)

Data of a value detected through the RGB sensor is converted into the brightness information corresponding to each of three primary colors R, G, and B by performing the function (15). The conversion is achieved by using constants a and b that had already been prepared for each of the colors and the brightness information is calculated through the following linear expressions. Here, the constants a and b that are used for the color R are determined to be $a_r$ and $b_r$, the constants a and b that are used for the color G are determined to be $a_g$ and $b_g$, and the constants a and b that are used for the color B are determined to be $a_b$ and $b_b$.

$$\text{red brightness information} = \text{red brightness constant } a_r \times \text{red sensor value} + \text{red brightness constant } b_r$$

$$\text{green brightness information} = \text{green brightness constant } a_g \times \text{green sensor value} + \text{green brightness constant } b_g$$

$$\text{blue brightness information} = \text{blue brightness constant } a_b \times \text{blue sensor value} + \text{blue brightness constant } b_b$$

Figure 7:
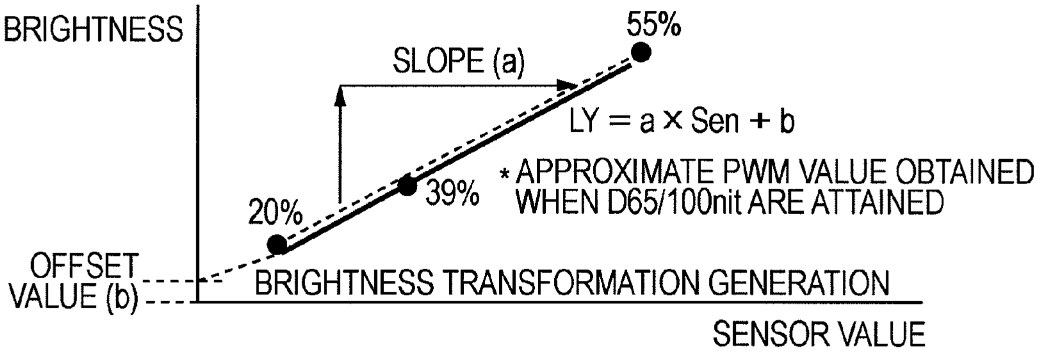
FIG. 7 illustrates how constants a and b are calculated.

FIG. 7 shows how the constants are calculated. In FIG. 7, the lateral axis indicates the detection value of the RGB sensor (referred to as an "RGB sensor value"), and the vertical axis indicates the brightness. First, when the display device is being assembled and adjusted, the PWM value of the CCFL is set to three points corresponding to 20%, 39%, and 55%, and the RGB sensor value is calculated at each of the points. Here, the PWM value 39% is an approximate PWM value obtained when the white standard D65 and the light amount 100 nit are attained.

Then, when the video signal corresponding to each of the colors R, G, and B is transmitted to the liquid crystal panel, brightness is measured on the video display screen of the liquid crystal panel. FIG. 7 shows a plot of the relationships between the RGB sensor values obtained at the three points and the brightness measured on the video display screen of the liquid crystal panel. Of the three points shown in the plot, the PWM value 20% and the PWM value 55% are connected to each other with a straight line, and the slope is calculated based on the above-described straight line and determined to be the constant a. An intercept of a straight line on the brightness axis, the straight line having the above-described slope and passing through the PWM value 39%, is determined to be the constant b which is an offset value.

The above-described constants a and b are obtained for each of the colors R, G, and B, and data of the constants a and b is stored in a nonvolatile memory or the like. The constants a and b obtained for each of the colors R, G, and B are obtained for each combination of the CCFL and the liquid crystal panel (the display unit shown in FIG. 2), and data of the obtained constants a and b corresponding to each of the colors R, G, and B is stored in a nonvolatile memory provided in the calculating unit 41*a* of the light source-control unit 41 shown in the configuration diagram of FIG. 2. Therefore, if the display unit is replaced with a different display unit, data stored in the nonvolatile memory is changed to data of the constants a and b that had already been obtained and that correspond to the display unit. Further, when the nonvolatile memory is provided in the display unit and stores data of the constants a and b that correspond to the above-described display unit, only the display unit-replacement is performed.

(Operation 2)

Next, the white brightness is calculated by merging the brightnesses of the colors R, G, and B with one another, the brightnesses being calculated through Operation 1. Namely, the calculated value becomes information about the brightness of the CCFL, the brightness being calculated based on the light amount detected through the RGB sensor.

(Operation 3)

Figure 8:
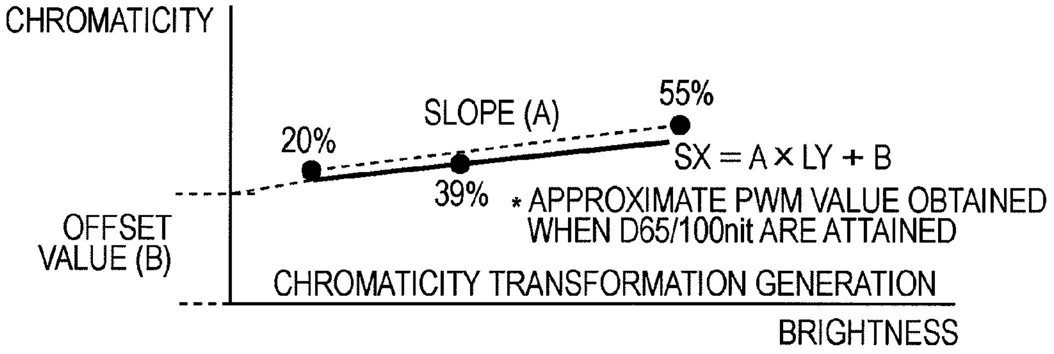
FIG. 8 illustrates how constants A and B are calculated.

Next, the white brightness obtained through Operation 2 is converted into the chromaticity coordinates (x, y) of each of the colors R, G, and B by performing the function (8). The conversion is achieved through the following linear expression by using the constants A and B that had already been prepared for each color. Here, constants A and B for a red chromaticity x are determined to be $A_{xr}$ and $B_{xr}$/those for a red chromaticity y are determined to be $A_{yr}$ and $B_{yr}$, those for a green chromaticity x are determined to be $A_{xg}$ and $B_{xg}$, those for a green chromaticity y are determined to be $A_{yg}$ and $B_{yg}$, those for a blue chromaticity x are determined to be $A_{xb}$ and $B_{xb}$, and those for a blue chromaticity y are determined to be $A_{yb}$ and $B_{yb}$, red chromaticity $x$=red chromaticity $x$ constant $A_{xr}$× white brightness value+red chromaticity $x$ constant $B_{xr}$ red chromaticity $y$=red chromaticity $y$ constant $A_{yr}$× white brightness value+red chromaticity $y$ constant $B_{yr}$ green chromaticity $x$=green chromaticity $x$ constant $A_{xg}$×white brightness value+green chromaticity $x$ constant $B_{xg}$ green chromaticity $y$=green chromaticity $y$ constant $A_{yg}$×white brightness value+green chromaticity $y$ constant $B_{yg}$ blue chromaticity $x$=blue chromaticity $x$ constant $A_{xb}$× white brightness value+blue chromaticity $x$ constant $B_{xb}$ blue chromaticity $y$=blue chromaticity $y$ constant $A_{yb}$× white brightness value+blue chromaticity $y$ constant $B_{yb}$ FIG. 8 shows how the constants are obtained. In FIG. 8, the lateral axis indicates the white brightness and the vertical axis indicates the chromaticity. First, when the display device is being assembled and adjusted, the PWM value of the CCFL is set to three points corresponding to 20%, 39%, and 55%, and the RGB sensor value is calculated at each of the points. Here, the PWM 39% is an approximate PWM value obtained when the white standard D65 and the light amount 100 nit are attained.

Then, when the video signal corresponding to each of the colors R, G, and B is transmitted to the liquid crystal panel, a chromaticity is measured on the video display screen of the liquid crystal panel. Further, the white brightness is calculated at each of the points through the processing corresponding to Operations 1 and 2 for the RGB sensor value obtained at each of the points. FIG. 8 shows a plot of the relationships between the white brightnesses obtained at the three points and the chromaticity measured on the display screen of the liquid crystal panel. Of the three points shown in the plot, the PWM value 20% and the PWM value 55% are connected to each other with a straight line, and the slope is calculated based on the above-described straight line and determined to be the constant A. An intercept of a straight line on the chromaticity axis, the straight line having the above-described slope and passing through the PWM value 39%, is determined to be the constant B which is an offset value.

The above-described constants A and B are obtained for each of the chromaticities x and y of each of the colors R, G, and B, and data of the constants A and B is stored in a nonvolatile memory or the like. As is the case with the constants a and b, the constants A and B are obtained for each combination of the CCFL and the liquid crystal panel (the display unit shown in FIG. 2), and data of the obtained constants A and B is stored in a nonvolatile memory provided in the calculating unit 41*a* and/or the display unit shown in FIG. 2.

(Operation 4)

Next, a gain by which the video signal is multiplied is calculated so as to correct a change in the chromaticity and/or the brightness, where the change occurs due to a variation in the CCFL, by performing the function (6) based on the chromaticity information and the brightness information that are calculated for each of the colors R, G, and B. Three types of gains including gains R, G, and B are obtained so that the video signals corresponding to the individual colors of R, G, and B are multiplied by the individual gains R, G, and B. The gains R, G, and B are obtained by performing the following steps.

Figure 9:
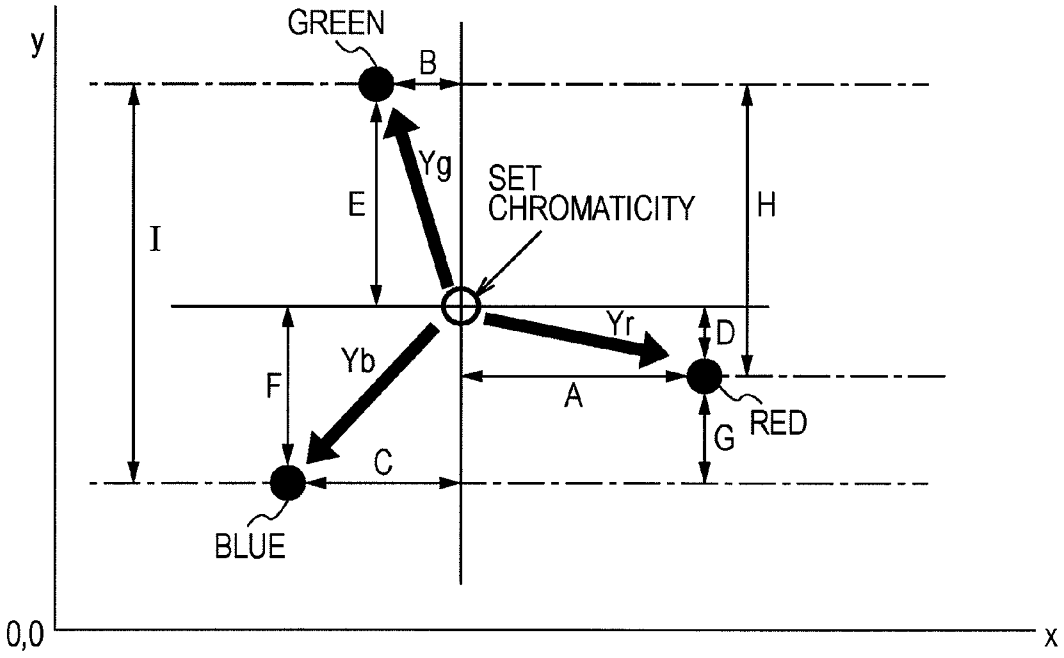
FIG. 9 shows how gains R, G, and B are calculated.

FIG. 9 shows how the gains R, G, and B are calculated, and the relationship between a chromaticity set on an xy color space and the chromaticity of each color, the chromaticity being attained based on the detection value of the RGB sensor.

"1" . . . Distance A between a target chromaticity x and a red chromaticity x is calculated.

distance $A$=set chromaticity $x$−red chromaticity $x$ acquired from RGB sensor

"2" . . . Distance B between the target chromaticity x and a green chromaticity x is calculated.

distance $B$=set chromaticity $x$−green chromaticity $x$ acquired from RGB sensor "3" . . . Distance C between the target chromaticity x and a blue chromaticity x is calculated.

distance $C$=set chromaticity $x$−blue chromaticity $x$ acquired from RGB sensor "4" . . . Distance D between a target chromaticity y and a red chromaticity y is calculated.

distance $D$=red chromaticity $y$ acquired from RGB sensor−set chromaticity $y$

"5" . . . Distance E between the target chromaticity y and a green chromaticity y is calculated.

distance $E$=green chromaticity $y$ acquired from RGB sensor−set chromaticity $y$ "6" . . . Distance F between the target chromaticity y and a blue chromaticity y is calculated.

distance $F$=blue chromaticity $y$ acquired from RGB sensor−set chromaticity $y$ "7" . . . Difference G between red chromaticity y and blue chromaticity y is calculated.

difference $G$=blue chromaticity $y$ acquired from RGB sensor−red chromaticity $y$ acquired from RGB sensor "8" . . . Difference H between red chromaticity y and green chromaticity y is calculated.

difference $H$=green chromaticity $y$ acquired from RGB sensor−red chromaticity $y$ acquired from RGB sensor "9" . . . Difference I between blue chromaticity y and green chromaticity y is calculated.

difference $I$=blue chromaticity $y$ acquired from RGB sensor−green chromaticity $y$ acquired from RGB sensor "10" . . . Red brightness Yr is calculated so that a set chromaticity is attained when three primary colors R, G, and B are merged with one another.

brightness $Yr=-1\times$red chromaticity $y$ acquired from RGB sensor$\times(C\times E-B\times F)\div$(set chromaticity $y\times(B\times G-C\times H-A\times I)$)

"11" . . . Green brightness Yg is calculated so that a set chromaticity is attained when three primary colors R, G, and B are merged with one another.

brightness $Yg=1\times$green chromaticity $y$ acquired from RGB sensor$\times(C\times D-A\times F)\div$(set chromaticity $y\times(B\times G-C\times H-A\times I)$)

"12" . . . Blue brightness Yb is calculated so that a set chromaticity is attained when three primary colors R, G, and B are merged with one another.

brightness $Yb=1-Yr-Yg$

Figure 10:
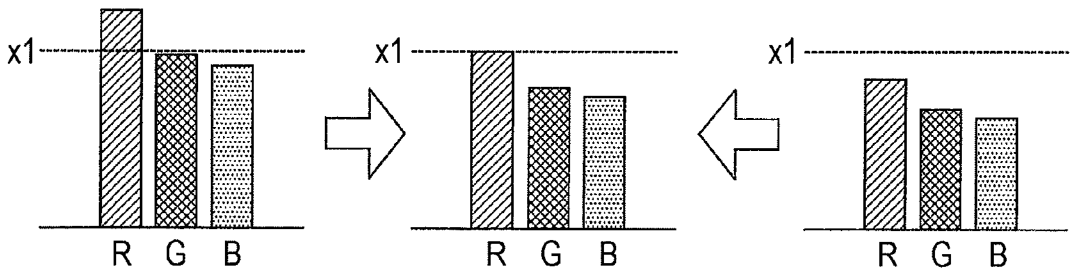
FIG. 10 illustrates how the rate of each of the gains R, G, and B is adjusted.

"13" The gains R, G, and B are obtained based on the ratio between the current brightness of each of the colors R, G, and B, the current brightness being acquired from the RGB sensor, and the brightness obtained through each of the calculations performed at "10", "11", and "12".

gain $R=Yr\times$white brightness obtained based on the RGB sensor value÷red brightness obtained based on the RGB sensor value gain $G=Yg\times$white brightness obtained based on the RGB sensor value÷green brightness obtained based on the RGB sensor value gain $B=Yb\times$white brightness obtained based on the RGB sensor value÷blue brightness obtained based on the RGB sensor value After that, the values of the three gains R, G, and B are adjusted at the same rate so that the calculated gain of each of the colors R, G, and B becomes one time at the maximum. FIG. 10 illustrates how the rate of each of the gains R, G, and B is adjusted. In FIG. 10, the rate is adjusted to that of the gain R, which is the largest of the three calculated gains R, G, and B. Namely, each of the gains G and B is multiplied by a rate which makes the gain R one time. Accordingly, adjustment is achieved so that the largest gain becomes one time.

(Operation 5)

Next, an externally transmitted video signal is converted into the video signals corresponding to the individual colors R, G, and B by performing the function (1), and subjected to the de-gamma processing by performing the function (2). The R video signal, the G video signal, and the B video signal are multiplied by the individual calculated gains R, G, and B by performing the function (3). After that, the gamma correction is attained by performing the function (4) and the uniformity correction is attained by performing the function (5), and the video signals are transmitted to the liquid crystal panel.

(Operation 6)

At that time, the brightness measured on the video display screen of the display panel is changed due to the gains R, G, and B. Therefore, the rate of the change in the brightness is calculated by performing the function (7), and the brightness correction amount (brightness correction gain) is obtained. In actuality, the video signal is multiplied by the gain which is one time at the maximum. Therefore, the brightness is moved in a downward direction. The reduced brightness and the brightness correction gain are calculated through the following equations:

reduced red brightness=red brightness obtained based on the detection value of RGB sensor×gain $R$, reduced green brightness=green brightness obtained based on the detection value of RGB sensor×gain $G$, reduced blue brightness=blue brightness obtained based on the detection value of RGB sensor×gain $B$, and reduced white brightness=reduced red brightness+reduced green brightness+reduced blue brightness brightness correction gain=brightness correction gain×set brightness reduced white brightness (where the initial value of the brightness correction gain is determined to be 1).

(Operation 7)

Next, the brightness correction gain is multiplied by a reference brightness value by performing the function (9) so that the target brightness value is calculated. At the same time, the brightness correction gain is multiplied by a reference PWM value by performing the function (10) so that the target PWM value is calculated.

(Operation 8)

Next, the ratio between the target brightness value and the white brightness value calculated by performing the function (14) is obtained through the function (11), and the value of the ratio is determined to be a brightness feedback coefficient.

(Operation 9)

Next, the target PWM value is multiplied by the brightness feedback coefficient by performing the function (13) so that a PWM value given to the CCFL is calculated. Consequently, the brightness of the CCFL is increased so that the chromaticity of the CCFL is changed, of which information is incorporated into the white brightness. The white brightness changes the chromaticity information about each of the colors R, G, and B so that the correction is automatically attained.

(Operation 10)

The above-described operations are repeatedly performed in real time so that video output from the liquid crystal panel is not affected by a change in the chromaticity and/or the brightness of the CCFL, which makes it possible to achieve a stable color temperature and stable brightness.

Other Application Examples

In any of the display devices of the above-described embodiments, the light modulating unit 10, the light source 20, the detecting unit 30, and the control unit 40 that are shown in FIGS. 1 and 2 may be incorporated into the display unit. Further, the detecting unit 30 and the control unit 40 may be incorporated in the panel of the light source 20 so that a light source-for-display device is configured.

Further, in the above-described various expressions, the coordinates of the xy color space are provided as a color space. However, the coordinates of a different color space (e.g., the coordinates a*and b* of La*b*) may be used.

The present application contains subject matter related to that disclosed in Japanese Priority Patent Application JP 2008-323366 filed in the Japan Patent Office on Dec. 19, 2008, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A display device comprising:

a light modulating unit configured to modulate light based on a video signal;

a light source configured to supply light to the light modulating unit such that the supplied light is modulated based on said video signal;

a detecting unit configured to detect a light amount emitted by the light source; and a control unit configured to calculate chromaticity information and brightness information based on the detected light amount and to perform control for correcting the video signal based on the calculated chromaticity and brightness information so as to attain a color temperature and brightness that had already been set for the light supplied by the light source.

2. The display device according to claim 1, wherein the detecting unit detects the light amount for each of red (R), green (G), and blue (B); and wherein the control unit calculates an adjusted value of each of the R, the G, and the B of the video signal based on the detected light amount of each of the R, the G, and the B so that the color temperature and the brightness that had already been set are attained, and performs control so as to correct the video signal based on the adjusted value.

3. The display device according to claim 2, wherein the control unit includes:

a conversion unit configured to convert the detected light amount of each of the R, the G, and the B into chromaticity information and brightness information; and a calculating unit configured to calculate the adjusted value of each of the R, the G, and the B based on the converted chromaticity information and the converted brightness information of each of the R, the G, and the B so as to attain the color temperature and the brightness that had already been set.

4. A display device comprising:

a light modulating unit configured to modulate light based on a video signal;

a light source configured to supply light to the light modulating unit;

a detecting unit configured to detect a light amount of the light source; and a control unit configured to perform control for correcting the video signal based on the detected light amount so as to attain a color temperature and brightness that had already been set, wherein the control unit includes:

a brightness correction value-calculating unit configured to calculate a brightness correction value based on a difference between a variation in brightness for output video data, the variation occurring due to a video signal obtained after the video signal correction is performed, and the brightness that had already been set; and a light source brightness-control unit configured to control brightness of the light source based on the brightness correction value calculated through the brightness correction value-calculating unit.

5. The display device according to claim 4, wherein the detecting unit detects the light amount of the light source controlled by the light source brightness-control unit, and the detected light amount is fed back to the control unit.

6. The display device according to claim 1, wherein the chromaticity of the light source is changed due to a variation in brightness.

7. The display device according to claim 6, wherein the light source is a cold cathode fluorescent lamp.

8. The display device according to claim 1, wherein the light modulating unit modulates light through liquid crystal.

9. A method of controlling a display device, the method comprising the steps of:

detecting an amount of light supplied from a light source when the supplied light is modulated for display based on a video signal; and calculating chromaticity information and brightness information based on the detected light amount and performing control to correct the video signal based on the calculated chromaticity and brightness information so as to attain a color temperature and brightness that had already been set for the light supplied by the light source.

* * * * *